United States Patent
Azuma et al.

(10) Patent No.: US 8,721,787 B2
(45) Date of Patent: May 13, 2014

(54) METHOD FOR MANUFACTURING SILICON SINGLE CRYSTAL

(75) Inventors: Yukinaga Azuma, Tokyo (JP); Masaki Morikawa, Akita (JP)

(73) Assignee: Japan Super Quartz Corporation, Akita (JP)

( * ) Notice: Subject to any disclaimer, the term of this patent is extended or adjusted under 35 U.S.C. 154(b) by 1170 days.

(21) Appl. No.: 12/647,659

(22) Filed: Dec. 28, 2009

(65) Prior Publication Data

US 2010/0162944 A1    Jul. 1, 2010

(30) Foreign Application Priority Data

Dec. 29, 2008   (JP) .................................. 2008-335813

(51) Int. Cl.
   *C30B 15/14*   (2006.01)

(52) U.S. Cl.
   USPC .................... 117/35; 117/11; 117/13; 117/20; 117/34; 117/932

(58) Field of Classification Search
   USPC ............................ 117/11, 13, 20, 34, 35, 932
   See application file for complete search history.

(56) References Cited

U.S. PATENT DOCUMENTS

| | | | |
|---|---|---|---|
| 4,676,968 A * | 6/1987 | Sanjurjo et al. | 423/350 |
| 6,036,932 A * | 3/2000 | Hongu et al. | 423/348 |
| 6,340,390 B1 * | 1/2002 | Asano et al. | 117/13 |
| 2002/0083887 A1 * | 7/2002 | Holder | 117/13 |
| 2008/0295294 A1 * | 12/2008 | Skelton et al. | 23/295 R |
| 2009/0084308 A1 | 4/2009 | Kishi et al. | |

FOREIGN PATENT DOCUMENTS

| | | |
|---|---|---|
| JP | 5-009097 | 1/1993 |
| JP | 2000-169287 | 6/2000 |
| JP | 2007-210803 | 8/2007 |
| KR | 10-0771479 B1 | 10/2007 |

* cited by examiner

*Primary Examiner* — Matthew Song
(74) *Attorney, Agent, or Firm* — Greenblum & Bernstein, P.L.C.

(57) ABSTRACT

A method for manufacturing a silicon single crystal is provided including producing a silicon melt in a chamber by melting a silicon raw material loaded into a silica glass crucible under a reduced pressure and high temperature, removing gas bubbles from within the silicon melt by rapidly changing at least the pressure or temperature within the chamber, and pulling up the silicon single crystal from the silicon melt after the gas bubbles are removed. When the pressure is rapidly changed, the pressure within the chamber is rapidly changed at a predetermined change ratio. In addition, when the temperature is rapidly changed, the temperature within the chamber is rapidly changed at a predetermined change ratio. In this way, Ar gas attached to an inner surface of the crucible and h is the cause of the generation of SiO gas is removed.

6 Claims, 2 Drawing Sheets

METHOD FOR MANUFACTURING SILICON SINGLE CRYSTAL

TECHNICAL FIELD

The present invention is related to a method for manufacturing a silicon single crystal. In particular, the present invention is related to a method of preventing the generation of void defects in a silicon single crystal.

BACKGROUND OF THE INVENTION

A silica glass crucible is used in the manufacture of a silicon single crystal. In a Czochralski (CZ) method, polysilicon is charged into a silica glass crucible, heated and melted and a seed crystal is immersed in this silicon melt, and while mutually rotating the crucible and the seed crystal, the seed crystal is slowly pulled up and a silicon single crystal is grown. In order to manufacture a high purity silicon single crystal for use in semiconductor devices, it is necessary that the silicon single crystal not be polluted by an elution of impurities which are included within the silica glass crucible and in addition, the silica glass crucible requires sufficient heat resistance strength.

The weight of the silicon which is charged into a crucible is increasing due to the large scale of silicon ingots in recent years. As a result, it becomes more difficult to remove gas bubbles which are included within the silicon melt and these gas bubbles are incorporated into the silicon single crystal during growth causing void defects (also called air pockets) which are formed within the crystal. Such problems have become noticeable. Argon (Ar) gas which is attached to the inner surface of the silica glass crucible, and silicon monoxide (SiO) gas which is produced by a reaction between the silica glass crucible and silicon melt are known as causes of the void defects. The void defects caused by gas bubbles largely have a spherical shape with a diameter of 300-500 μm taking up the majority of its size. However, very small void defects with a diameter of 150 μm or less and very large void defects with a diameter of 1 mm or more are also sometimes formed. In this way, void defects caused by gas bubbles clearly have different characteristics to Grown-in defects such as COP (Crystal Originated Particle). Presently, the presence of these defects can not be nondestructively inspected. The void defects can be detected only after a wafer has been cut from the ingot and appear as through holes or pinholes on the surface or interior section of the wafer.

In order to solves this problem, a method of adjusting a furnace pressure when melting polysilicon is proposed, for example, in Japanese Patent Application Laid Open Nos. H05-9097 and 2000-169287. In addition, a method of providing vibration to a crucible and starting growth of a silicon single crystal after reducing gas bubbles which are attached to the inner surface of the crucible is proposed in Japanese Patent Application Laid Open No. 2007-210803.

In recent years, the effects on semiconductor devices by pinholes with a wafer are extremely large. The effects of pinholes differ depending on the size, number, position of generation and type of semiconductor device. However, because pinholes are very large compared to COP, device can not be formed at all in spaces where pinholes exist. In particular, because yield of the semiconductor device decreases significantly when the number of pinholes within a wafer is large, the wafer itself has to be discarded. Therefore, it is necessary to reduce the possibility of pinholes being included within a wafer to almost zero.

However, gas bubbles can not be sufficiently removed by simply setting the furnace pressure when melting polysilicon higher or lower than when pulling up a silicon single crystal and thus a better method for sufficiently removing these gas bubbles is required.

SUMMARY OF THE INVENTION

The present invention solves the problems described above and the object of the present invention is to provide a silicon single crystal manufacturing method which can manufacture a high quality silicon single crystal without void defects caused by gas bubbles.

As a result of repeated keen research which should solve the above described problem, the inventors of the present invention discovered that rapidly changing an environment within a chamber and breaking off air bubbles attached to an inner surface of the crucible is effective for removing gas bubbles within a crucible.

The present invention is based on this type of technical findings and the manufacturing method of a silicon single crystal according to the present invention includes melting in a chamber a polysilicon raw material which is loaded into a silica glass crucible, removing gas bubbles from a silicon melt within the silica glass crucible by rapidly changing at least one of a chamber internal pressure and temperature, and pulling up a silicon single crystal after the gas bubbles are removed.

According to the present invention, because the pulling process of a silicon single crystal ingot is started after removing gas bubbles included in a silicon melt within a silica glass crucible by rapidly changing an environment within a chamber, it is possible to avoid a state in which gas bubbles are generated during the pulling process of the silicon single crystal and are incorporated into the crystal forming void defects and thus it is possible to manufacture a high quality silicon single crystal.

In the present invention, it is preferred that a pressure change ratio within a chamber when removing gas bubbles from within a silicon melt is larger than a pressure change ratio when reducing pressure within the chamber for melting a silicon raw material, and a temperature change ratio within the chamber when removing gas bubbles from within a silicon melt is larger than a temperature change ratio when using a high temperature within the chamber for melting the silicon raw material.

In the present invention, it is preferred that a pressure change ratio within a chamber when removing gas bubbles from within a silicon melt is 5 times or more and 1000 times or less than a pressure change ratio when reducing pressure within the chamber for melting a silicon raw material. In this case, it is particularly preferred that the speed in decrease of pressure within the chamber when removing gas bubbles from within the silicon melt is 1.5 hPa/sec or more and 20 hPa/sec or less.

In the case where pressure within the chamber is rapidly decreased, it is thought that SiO gas is generated within the crucible, the SiO gas attaches to Ar gas which is attached to the inner surface of the crucible forming larger gas bubbles which ascend in the silicon melt. Therefore, it is possible to remove Ar gas which is attached to the inner surface of the crucible and which is the cause of the generation of SiO gas, and in particular, in the case where this process is repeated a plurality of times, it becomes possible to further remove gas bubbles with certainty.

In the present invention, it is preferred that a temperature change ratio within a chamber when removing gas bubbles from within a silicon melt is 5 times or more and 100 times or less than when using a high temperature within the chamber for melting the silicon raw material. In this case, it is particularly preferred that the temperature increase rate within the chamber when removing gas bubbles from within the silicon melt is 0.5° C./sec or more and 5° C./sec or less.

In the case where the temperature within the chamber is rapidly increased, the same as in the case of reducing pressure, it is possible to remove Ar gas which is attached to the inner surface of the crucible and which is the cause of the generation of SiO gas, and in particular, in the case where this process is repeated a plurality of times, it becomes possible to further remove gas bubbles with certainty.

In the present invention, it is preferable to change the pressure and temperature within the chamber simultaneously when removing gas bubbles. In this way, it is possible to sufficiently remove gas bubbles within the crucible.

In this way, according to the present invention, it is possible to provide a silicon single crystal manufacturing method which can manufacture a high quality silicon single crystal without void defects caused by gas bubbles.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENT

Preferred embodiments of the present invention will now be described in detail hereinafter with reference to the accompanying drawings.

Figure 1:
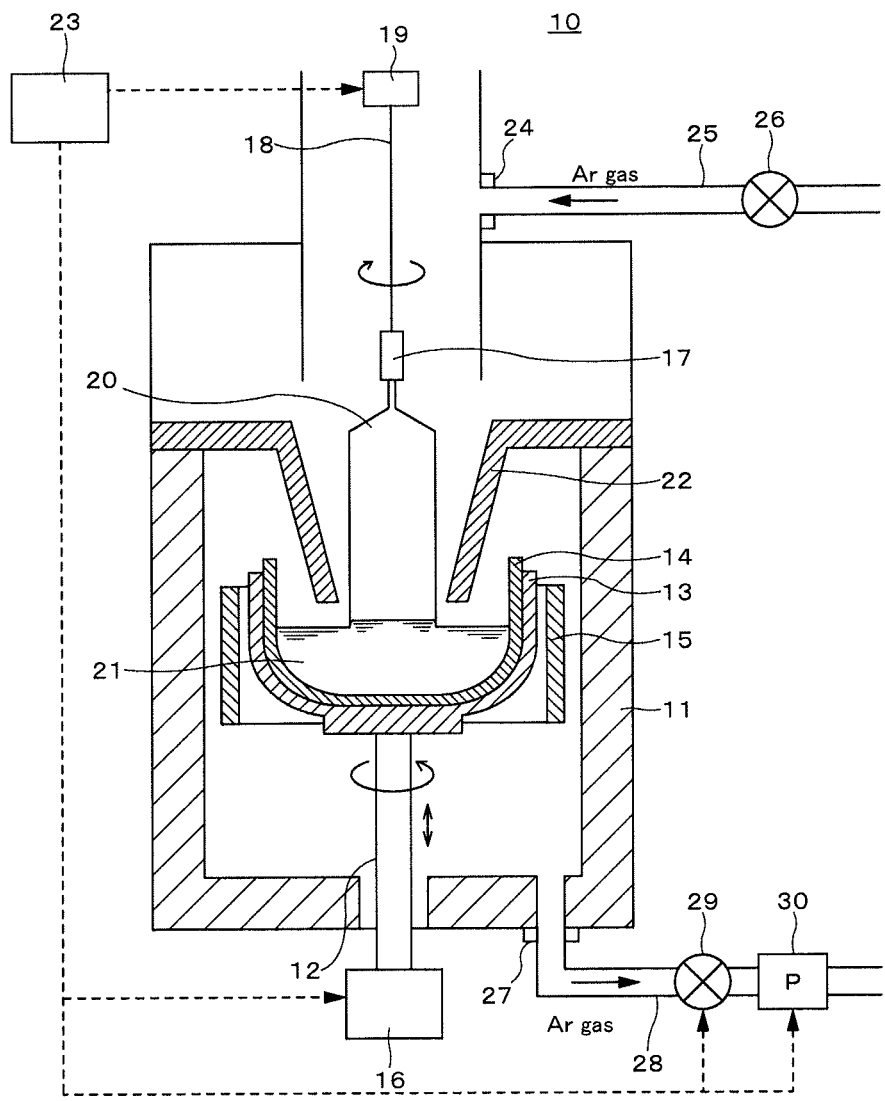
FIG. 1 is an exemplary diagram which shows the structure of a silicon single crystal pulling apparatus according to a preferred embodiment of the present invention.

FIG. 1 is an exemplary diagram which shows the structure of a silicon single crystal pulling apparatus according to a preferred embodiment of the present invention;

As shown in FIG. 1, a silicon single crystal pulling apparatus 10 is arranged with a chamber 11, a support axis 12 arranged in a perpendicular direction passing through the center of a bottom part of the chamber 11, a graphite susceptor 13 fixed to a top of the support axis 12, a silica glass crucible 14 housed within the graphite susceptor 13, a heater 15 arranged on the periphery of the graphite susceptor 13, a support axis drive mechanism 16 for rising and rotating the support axis 12, a seed chuck 17 which supports a seed crystal, a wire 18 which suspends the seed chuck 17, a wire winding mechanism 19 for winding in the wire 18, a thermal shield 22 for preventing heating of the silicon single crystal 20 by radiation heat from the heater 15 and silica glass crucible 14, and also for reducing temperature variation of the silicon melt 21, and a controller 23 for controlling each part.

A gas inlet 24 is arranged on the upper part of the chamber 11 for introducing Ar gas into the chamber 11. Ar gas is introduced into the chamber 11 from the gas inlet 24 via a gas pipe 25 and the amount introduced is controlled by a conductance valve 26.

A gas vent 27 is arranged on the bottom part of the chamber 11 for discharging Ar gas from within the chamber 11. The Ar gas sealed within the chamber 11 is externally discharged from the gas vent 27 via a gas discharge pipe 28. A conductance valve 29 and a vacuum pump 30 are arranged along the gas discharge pipe 28 and the low pressure condition within the chamber 11 is maintained by controlling the flow amount with the conductance valve 29 while sucking out the Ar gas from within the chamber 11 with the pump 30.

The manufacturing method of a silicon single crystal according to the present embodiment is effective in the case where a large scale crucible with a diameter of 32 inches (about 800 mm) or more is used. This is because in such a large silica glass crucible, Ar gas becomes easily trapped within the crucible when melting polysilicon and the possibility that void defects are formed in the silicon single crystal is high. A various type of crucible can be used as the silica glass crucible, from a crucible formed with only natural silica as the raw material to a high purity silica glass crucible formed using synthetic silica on an inner surface.

Next, a manufacturing method of the silicon single crystal will be explained in detail while referring to the flow chart in FIG. 2.

Figure 2:
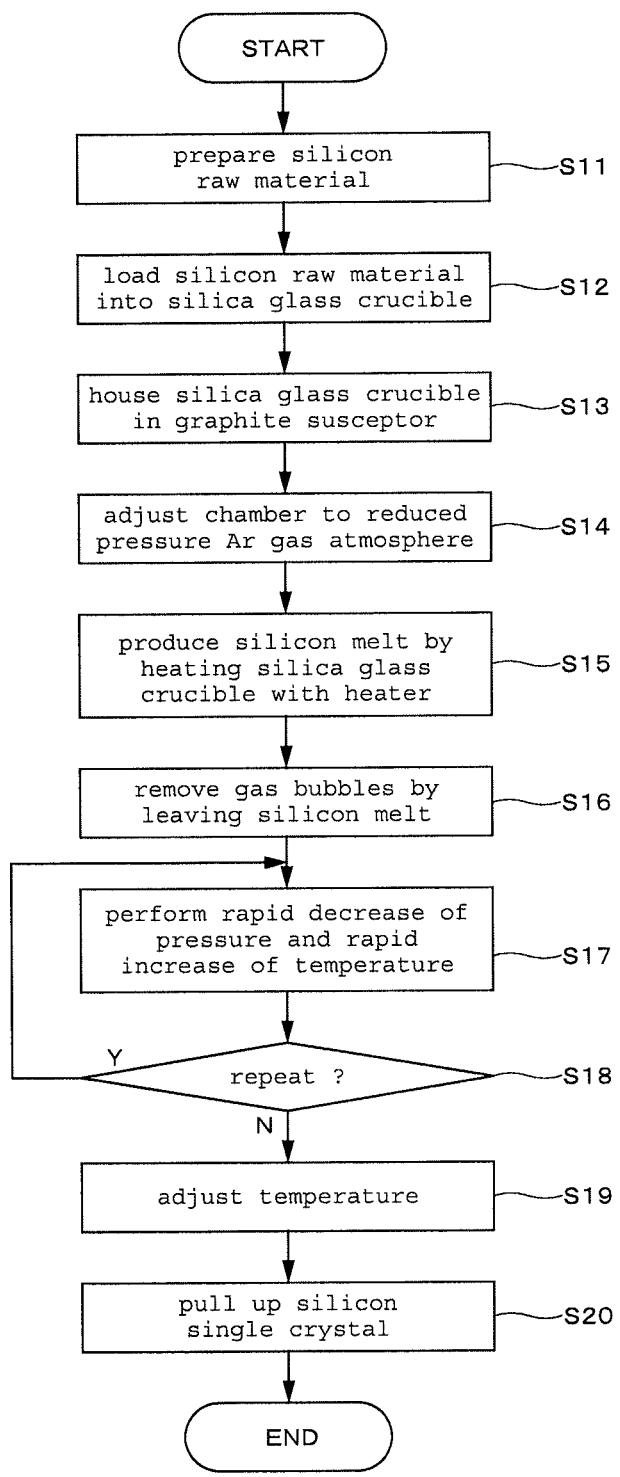
FIG. 2 is a flowchart which shows a manufacturing method of a silicon single crystal according to the preferred embodiment of the present invention.

As shown in FIG. 2, when manufacturing the silicon single crystal, first polysilicon which is the raw material of the silicon single crystal is prepared (step S11), after an appropriate amount of polysilicon chunks are loaded into the silica glass crucible 14 (step S12) the silica glass crucible is housed within the graphite susceptor 13 which is housed in the chamber 11 (step S13).

Next, after reducing the pressure (initial vacuuming) within the chamber 11 with the vacuum pump 30, Ar gas is introduced from the gas inlet 24 and a reduced pressure Ar gas atmosphere is created within the chamber 11 (step S14). Following this, the silica glass crucible 14 within the chamber 11 is heated with the heater 15 (initial heating) and the polysilicon within the silica glass crucible 14 is melted (step S15). At this time, the pressure within the chamber 11 is 25-200 hPa and the temperature within the chamber 11 is 1500° C.-1600° C. In addition, the pressure decrease rate within the chamber 11 is preferred to be 0.012-0.3 hPa/sec and the temperature increase rate within the chamber 11 is preferred to be 0.02-0.5° C./sec. Following this, the silicon melt is left for a while as the temperature and pressure within the chamber 11 are maintained at a constant rate and the gas within the silicon melt is sufficiently discharged (step S16). At this time, almost all the gas that exists within the crucible is extracted. However, as stated above, it is easy for Ar gas to remain within the crucible.

Next, the pressure within the chamber is rapidly decreased by control of the conductance valve 29 and at the same time, the output of the heater 15 is increased and the temperature within the chamber 11 is rapidly increased (step S17). The pressure within the chamber 11 is preferred to be decreased to 7-100 hPa and at this time the pressure decrease rate is preferred to be 1.5-20 hPa/sec. This is because when the speed in decrease of pressure is smaller than 1.5 hPa/sec the desired effects of removing gas bubbles can not be obtained, and when the speed in decrease of pressure is larger than 20 hPa/sec, the gas bubbles within the silica glass crucible may burst in the inner surface of the crucible. In addition, the temperature within the chamber 11 is preferred to be raised to 1600-1700° C. and at this time, the temperature increase rate is preferred to be 0.05-5° C./sec. This is because when the speed in increase of temperature is smaller than 0.5° C./sec the desired effects of removing gas bubbles can not be obtained, and when the speed in increase of temperature is larger than 5° C./sec, the heat distribution of the silica glass crucible because uneven and the silica glass crucible may become deformed.

In the case where the change ratio is used as a reference when the chamber is made a low pressure and high temperature for melting the polysilicon, the pressure change ratio within the chamber when removing gas bubbles is preferred to be 5 times or more and 1000 times or less than the pressure change ratio when reducing the pressure inside the chamber for melting the polysilicon. In addition, the temperature change ratio within the chamber when removing gas bubbles is preferred to be 5 times or more and 100 times or less than the temperature change ratio when the inside of the chamber is set to a high temperature for melting the polysilicon.

In this way, it is thought that in the case where the pressure and temperature within the chamber are rapidly changed, SiO gas is generated by a rapid reaction between the crucible and the silicon melt, the SiO gas bubbles become one unit with the Ar gas bubbles attached to the inner surface of the crucible making large gas bubbles which ascend within the silicon melt. Therefore, it is possible to remove the Ar gas attached to the inner surface of the crucible which is the cause of the generation of SiO gas.

The process of rapidly changing the pressure and temperature within the chamber 11 is not limited to once but may be performed a plurality of times (step S18). In this case, the pressure or temperature may be the same change ratio or a different change ratio in each process. In addition, the process of rapidly changing the pressure in a number of processes may be omitted, wherein only the temperature is rapidly changed. Alternatively, only the pressure may be rapidly changed in a number of processes. When the processes for rapidly changing the pressure and temperature are performed a plurality of times, it is possible to remove with certainty the Ar gas bubbles which are attached to the inner surface of the silica glass crucible 14.

Following this, after the temperature is adjusted until the silicon melt is stabilized at about 1500° C. (step S19), the pulling process of the silicon single crystal 20 is started (step S20). In the pulling process if the silicon single crystal 20, a seed crystal attached to the seed chuck 17 is dropped and made to contact with the silicon melt while the support axis 12 and the wire 18 are rotated in opposite directions, and after the seed crystal has been dipped into the silicon melt for a certain period of time, the silicon single crystal 20 is grown on the lower end of the seed crystal by slowly pulling up the seed crystal. Here, because gas bubbles are removed by rapidly changing the pressure and temperature within the chamber 11 before cultivation of the silicon single crystal 20 is started, almost no Ar gas remains within the silica glass crucible 14. Therefore, the possibility that Ar gas bubbles are incorporated into the silicon single crystal 20 is extremely low.

In the pulling process of the silicon single crystal 20, first a necking process (forming a neck part) is performed by a dash method in order to make the single crystal dislocation free. Next, a shoulder part is cultivated in order to obtain a single crystal with the required diameter and a body part is cultivated by making the diameter constant when the single crystal has the required diameter. After the body part is cultivated to a predetermined length, a tailing process (forming a tail part) is performed in order to cut off the single crystal from the silicon melt while in a dislocation free state. Following this, the silicon single crystal ingot which is cut off from the silicon melt 21 is cooled under predetermined conditions. A silicon wafer process manufactured from the silicon single crystal ingot in this way is used as a substrate material for a variety of semiconductor devices.

As explained above, according to the present embodiment, because the pulling process of the silicon single crystal is started after the pressure within the chamber 11 is rapidly reduced and the temperature within is chamber 11 is rapidly increased and the gas bubbles included in the silicon melt within the silica glass crucible 14 are removed, it is possible to avoid the generation of gas bubbles within the silicon single crystal which are then incorporated into the crystal, and a state in which void defects are formed, thereby, a high quality silicon single crystal can be manufactured.

The present invention has thus been shown and described with reference to specific embodiments. However, it should be noted that the present invention is in no way limited to the details of the described arrangements but changes and modifications may be made without departing from the scope of the appended claims.

For example, in the embodiment described above, both pressure and temperature within a chamber were rapidly changed. However, only the pressure within the chamber may be changed or only the temperature within the chamber may be changed.

EXAMPLES

Example 1

400 kg of polysilicon chunks were loaded into a silica glass crucible having a 32 inch (800 mm) diameter. This silica glass crucible was housed in graphite susceptor within a single crystal pulling apparatus, and the polysilicon within the silica glass crucible was melted in the chamber. Next, Ar gas within the silica glass crucible was removed by rapidly changing both the pressure and temperature within the chamber. At this time, a decrease in pressure ratio was set at 10 hPa/sec and an increase in temperature ratio was set as 4° C./sec. Following this, a silicon single crystal ingot with an approximately 300 mm diameter was pulled up from the silicon melt.

Next, wafers of approximately 1 mm thickness were sliced from the silicon single crystal ingot that was pulled up using a wire saw and polished wafers with a mirror polished surface were created. Then, the pinhole generation rate in the polished wafers was measured. A particle measurement device was used to measure the pinhole generation rate and the number of pinholes in the surface of each polished wafer was measured. The pinhole generation rate is a value in which the total number of pinholes included within multiple wafers obtained from one silicon single crystal divided by the number of wafers. The results are shown in Chart 1.

CHART 1

|  | Conditions within the chamber | Pinhole generation rate |
| --- | --- | --- |
| Example 1 | Rapid change of both temperature and pressure (10 hPa/sec, 4° C./sec) | 0.05% |
| Example 2 | Rapid change of only pressure (10 hPa/sec) | 0.08% |
| Example 3 | Rapid change of only temperature (4° C./sec) | 0.15% |
| Comparative Example 1 | No change | 0.60% |
| Comparative Example 2 | Gradual change of only pressure (0.5 hPa/sec) | 0.50% |
| Comparative Example 3 | Gradual change of only temperature (0.1° C./sec) | 0.55% |

As shown in Chart 1, a very good result was obtained with the pinhole generation rate of wafers obtained from the silicon single crystal manufactured under the conditions according to the present embodiment being 0.05%, which is below 0.1%.

Example 2

Apart from fixing the temperature within the chamber and removing the Ar gas by rapidly changing only the pressure within the chamber, the pulling process of the silicon single crystal ingot was performed under the same conditions as in example 1. At this time, the decrease in pressure ratio was set at 10 hPa/sec. Next, the results of measuring the pinhole generation rate the same as example 1 are shown in Chart 1. As shown in Chart 1, a very good result was obtained with the pinhole generation rate of wafers obtained from the silicon single crystal manufactured under the conditions according to the present embodiment being 0.08%, which is below 0.1%.

Example 3

Apart from fixing the pressure within the chamber and removing the Ar gas by rapidly changing only the temperature within the chamber, the pulling process of the silicon single crystal ingot was performed under the same conditions as in example 1. At this time, the increase in temperature ratio was set at 4° C./sec. Next, the results of measuring the pinhole generation rate the same as example 1 are shown in Chart 1. As shown in Chart 1, a good result was obtained with the pinhole generation rate of wafers obtained from the silicon single crystal manufactured under the conditions according to the present embodiment being 0.15%, which is about the same as 0.1%.

Comparative Example 1

Apart from not changing the pressure or temperature within the chamber at all, the pulling process of the silicon single crystal ingot was performed under the same conditions as example 1. Next, the results of measuring the pinhole generation rate the same as example 1 are shown in Chart 1. As shown in Chart 1, the pinhole generation rate of wafers obtained from the silicon single crystal manufactured under the conditions according to the present embodiment was 0.60%.

Comparative Example 2

Apart from gradually changing the pressure within the chamber, the pulling process of the silicon single crystal ingot was performed under the same conditions as example 1. At this time, the decrease in pressure ratio was set at 0.5 hPa/sec. Next, the results of measuring the pinhole generation rate the same as example 1 are shown in Chart 1. As shown in Chart 1, the pinhole generation rate of wafers obtained from the silicon single crystal manufactured under the conditions according to the present embodiment was 0.50%.

Comparative Example 3

Apart from gradually changing the temperature within the chamber, the pulling process of the silicon single crystal ingot was performed under the same conditions as example 1. At this time, the increase in temperature ratio was set at 0.1° C./sec. Next, the results of measuring the pinhole generation rate the same as example 1 are shown in Chart 1. As is shown in Chart 1, the pinhole generation rate of wafers obtained from the silicon single crystal manufactured under the conditions according to the present embodiment was 0.55%.

What is claimed is:

1. A method for manufacturing a silicon single crystal comprising:
    producing a silicon melt in a chamber by melting a silicon raw material loaded into a silica glass crucible under a reduced pressure and a temperature;
    removing gas bubbles from within the silicon melt by changing at least the pressure or temperature within the chamber; and
    pulling up the silicon single crystal from the silicon melt after the gas bubbles are removed, wherein:
    a pressure change ratio within the chamber when removing the gas bubbles within the silicon melt is 5 times or more and 1000 times or less than a pressure change ratio when reducing the pressure inside the chamber in order to melt the silicon raw material, and
    a temperature change ratio within the chamber when removing the gas bubbles within the silicon melt is 5 times or more and 100 times or less than a temperature change ratio when increasing the temperature inside the chamber in order to melt the silicon raw material.

2. The method for manufacturing a silicon single crystal as claimed in claim 1, wherein a pressure decrease rate inside the chamber when removing the gas bubbles from the silicon melt is 1.5 hPa/sec or more and 20 hPa/sec or less.

3. The method for manufacturing a silicon single crystal as claimed in claim 1, wherein a temperature increase rate inside the chamber when removing the gas bubbles from the silicon melt is 0.5° C./sec or more and 5° C./sec or less.

4. The method for manufacturing a silicon single crystal as claimed in claim 1, wherein pulling up the silicon single crystal is started after removing the gas bubbles from the silicon melt by rapidly changing at least the pressure or temperature within the chamber is repeated a plurality of times.

5. The method for manufacturing a silicon single crystal as claimed in claim 1, wherein after producing the silicon melt and before removing the gas bubbles from the silicon melt by changing at least the pressure or temperature within the chamber, the silicon melt is left as the temperature and pressure within the chamber are maintained at a constant rate and the gas within the silicon melt is discharged.

6. The method for manufacturing a silicon single crystal as claimed in claim 1, wherein after the gas bubbles are removed, the temperature is adjusted until the temperature of the silicon melt is stable before pulling up the silicon single crystal from the silicon melt.

* * * * *